United States Patent

Wieser

[19]

[11] Patent Number: 5,818,377
[45] Date of Patent: Oct. 6, 1998

[54] BIPOLAR ELEMENT AVERAGING, DIGITAL-TO-ANALOG CONVERTER

[75] Inventor: James Brian Wieser, Pleasanton, Calif.

[73] Assignee: National Semiconductor Corporation, Santa Clara, Calif.

[21] Appl. No.: 842,658

[22] Filed: Apr. 15, 1997

[51] Int. Cl.[6] .................................................. H03M 1/66
[52] U.S. Cl. .......................................... 341/144; 341/143
[58] Field of Search .................................... 341/144, 143, 341/145, 150, 152

[56] References Cited

U.S. PATENT DOCUMENTS

| | | | |
|---|---|---|---|
| 5,329,282 | 7/1994 | Jackson et al. | 341/143 |
| 5,748,126 | 5/1998 | Ma et al. | 341/143 |

OTHER PUBLICATIONS

Rex T. Baird and Terri S. Fiez, "Linearity Enhancement of Multibit ΔΣ A/D and D/A Converters Using Data Weighted Averaging", IEEE Transactions on Circuits and Systems–II: Analog and Digital Signal Processing, vol. 42, Dec. No. 12, 1995, pp. 753–762.

R. Schreier, "Mismatch –Shaping DAC ", Category: Circuit Design, Reporting Period Jun. 1, 1996–Dec. 31, 1996, Department of Electrical and Coumputer Engineering Oregon State University, pp. 1–4.

R. Schreier, "Mismatch–Shaping DAC", Viewgraphs, Reporting Period July 1, 1996–Dec 31, 1996, Department of Electrical and Computer Engineering Oregon State University, Views 1–20.

*Primary Examiner*—Brain K. Young
*Attorney, Agent, or Firm*—Limbach & Limbach L.L.P.

[57] ABSTRACT

A bipolar, element averaging, digital to analog signal converter including a delta-sigma digital to analog converter ("ΔΣ DAC") with dual sequence controllers for controlling the switching sequences of the array of sampling capacitors used to sample a fixed reference voltage in the sample and hold amplifier. The sequence controllers receive the input digital signal and a sign bit which indicates whether the numeric value of the digital signal is positive or negative with respect to the mean value of its total dynamic range. Based upon the sign bit and the value of the digital signal, the sequence controllers generate two sets of switching sequence control signals: "positive" and "negative." Those digital signals whose numeric values are positive and negative with respect to the mean value are considered to be "positive" and "negative" signals, respectively, with corresponding positive and negative analog signals generated accordingly. The same capacitors in the sampling array are used in rotating sequences for sampling the reference voltage for both "positive" and "negative" input digital signals. The "positive" and "negative" switching sequence control signal sets each ensure that each capacitor in the sampling array is used a substantially equal number of times when converting "positive" and "negative" input digital signals. Such a converter can be used in digital to analog converters as well as analog to digital converters which use delta-sigma signal conversion techniques.

28 Claims, 8 Drawing Sheets

| VALUE | C1/C1n | C2/C2n | C3/C3n | C4/C4n | POLARITY | NONE |
|---|---|---|---|---|---|---|
| 2<br>3<br>1 | 1p<br>3p | 2p<br>1p | 1p | 2p | pos<br>pos<br>pos | |
| 0 | | | | | | X |
| -2<br>-4<br>-3<br>-2 | 1n<br>3n<br>3n | 2n<br>4n<br>1n | 1n<br>1n<br>2n | 2n<br>2n | neg<br>neg<br>neg<br>neg | |
| 1<br>3<br>4<br>2 | 2p<br>3p | 3p<br>4p | 1p<br>1p<br>1p | 1p<br>2p<br>2p | pos<br>pos<br>pos<br>pos | |
| 0 | | | | | | X |
| -2<br>-2<br>-1 | 2n | 1n | 2n | 1n<br>1n | neg<br>neg<br>neg | |

FIGURE 4

|  | POSITIVE | NEGATIVE | ZERO | COMMENT |
|---|---|---|---|---|
| $PHA_1$ | PH4 | PH3 | NO CHANGE | IF SELECTED |
| $PHB_1$ | PH3 | PH4 | NO CHANGE | IF SELECTED |
| $PHA_2$ | PH4 | PH3 | NO CHANGE | IF SELECTED |
| $PHB_2$ | PH3 | PH4 | NO CHANGE | IF SELECTED |
| $PHA_3$ | PH4 | PH3 | NO CHANGE | IF SELECTED |
| $PHB_3$ | PH3 | PH4 | NO CHANGE | IF SELECTED |
| $PHA_4$ | PH4 | PH3 | NO CHANGE | IF SELECTED |
| $PHB_4$ | PH3 | PH4 | NO CHANGE | IF SELECTED |

FIGURE 7

| INDEX START VALUE | NEEDED VALUE D/A MOD OUT | C'S SELECTED | INDEX END VALUE | 1=SELECTED, 0=NOT SELECTED | | | |
|---|---|---|---|---|---|---|---|
| | | | | C1 | C2 | C3 | C4 |
| 00 | 0 | NONE | 0 | 0 | 0 | 0 | 0 |
| 00 | 1 | C1 | 1 | 1 | 0 | 0 | 0 |
| 00 | 2 | C1,C2 | 10 | 1 | 1 | 0 | 0 |
| 00 | 3 | C1,C2,C3 | 11 | 1 | 1 | 1 | 0 |
| 00 | 4 | C1,C2,C3,C4 | 0 | 1 | 1 | 1 | 1 |
| 01 | 0 | NONE | 1 | 0 | 0 | 0 | 0 |
| 01 | 1 | C2 | 10 | 0 | 1 | 0 | 0 |
| 01 | 2 | C2,C3 | 11 | 0 | 1 | 1 | 0 |
| 01 | 3 | C2,C3,C4 | 0 | 0 | 1 | 1 | 1 |
| 01 | 4 | C2,C3,C4,C1 | 1 | 1 | 1 | 1 | 1 |
| 10 | 0 | NONE | 10 | 0 | 0 | 0 | 0 |
| 10 | 1 | C3 | 11 | 0 | 0 | 1 | 0 |
| 10 | 2 | C3,C4 | 0 | 0 | 0 | 1 | 1 |
| 10 | 3 | C3,C4,C1 | 1 | 1 | 0 | 1 | 1 |
| 10 | 4 | C3,C4,C1,C2 | 10 | 1 | 1 | 1 | 1 |
| 11 | 0 | NONE | 11 | 0 | 0 | 0 | 0 |
| 11 | 1 | C4 | 0 | 0 | 0 | 0 | 1 |
| 11 | 2 | C4,C1 | 1 | 1 | 0 | 0 | 1 |
| 11 | 3 | C4,C1,C2 | 10 | 1 | 1 | 0 | 1 |
| 11 | 4 | C4,C1,C2,C3 | 11 | 1 | 1 | 1 | 1 |

FIGURE 8

BIPOLAR ELEMENT AVERAGING, DIGITAL-TO-ANALOG CONVERTER

BACKGROUND OF THE INVENTION

1. Field of the Invention

The present invention relates to digital-to-analog converters (DACs), and in particular, to delta sigma ($\Delta\Sigma$) DACs.

2. Description of the Related Art

Single bit, delta sigma modulator based, DACs have been well known for providing high resolution performance using analog components with relatively low accuracy. The addition of multibit capability improves stability and the ratio of performance versus oversampling, and reduces idle tones as well as out of band noise which, in turn, reduces the post conversion filtering required. Unfortunately, however, this additional capability increases the accuracy requirements of the analog elements and the matching of such elements used in the DAC.

This requirement for more accurate analog components has been addressed by cycling, or sequentially using, unit analog DAC elements in order to "average" out the error. However, this simple cycling causes the errors to repeat and, consequently, raises the noise floor as well as introduces idle tones. A number of techniques have been used to improve this performance, such as randomizing and data dependent cycling which is often referred to as "data weighted averaging" (DWA). Data weighted averaging has produced good results by ensuring that each analog DAC element is used an equal number of times during the conversion process. This ensures more truly averaged errors and pushes the noise caused by such errors more effectively to higher frequencies which can be more easily filtered from the desired pass band. One example of a conventional DWA DAC is illustrated schematically in FIG. 1.

Referring to FIG. 1, a DWA DAC cycles, or sequences, through equal valued circuit elements in the DAC. A total of $2^N$ elements are required for N-bits of a multiple bit DAC. For example, if a 3-bit DAC is used, then eight elements are needed. As the input digital signal values ranges from its minimum, i.e., zero, to its maximum, i.e., $2^N$, the number of such elements used range from zero to the maximum (e.g., eight for a 3-bit DAC). Accordingly, there is no true center, or "zero" value. An index "calculator," or counter, in the form of a switch controller is used so that if capacitors C1, C2 and C3 are used for one output sample, the index starts with capacitor C4 for the next sample, and increments from there. When the index results in capacitor C8 being used, it cycles back to begin using capacitor C1. In this way, each element is guaranteed to be used an equal number of times. However, as noted above, even though there may be a theoretical center point, or "zero," this point will shift depending upon the accuracy of the capacitors, thereby causing signal or DC offset.

Hence, a significant disadvantage of the DWA technique is that the averaged error also causes the DC level to shift, thereby effectively adding an offset voltage to the analog output signal. Simulations have shown that for a one volt full scale output, this offset can be in the range of 20–30 millivolts. For applications which require a high degree of DC accuracy, this poses a significant problem.

SUMMARY OF THE INVENTION

A bipolar, element averaging, digital-to-analog signal converter in accordance with the present invention uses the same sampling elements for both positive and negative signals around a true center, or "zero," point. This has the advantageous effect of either doubling the number of signal levels available (due to the positive and negative cycles), or reducing by half the number of matched circuit elements required. Further, a true "zero" is provided by using none of the circuit elements for the "zero" signal. This is accomplished by using two sequence controllers in the form of "calculators" or counters. One controller is used for positive signals, while the other is used for negative signals. The index of each controller is incremented only during its respective half cycle, thereby ensuring that each circuit element is used an equal number of times for both positive and negative signals. This provides an improved signal to noise ratio, while providing a true "zero" output, as well as reducing the number of circuit elements required.

In accordance with one embodiment of the present invention, a bipolar, element averaging, digital to analog signal converter includes a sampling controller and a number of sampling circuits. The sampling controller is configured to receive a multiple bit digital signal and a sign signal (e.g., from a delta sigma modulator) and in accordance therewith provide a number of sampling control signals. The multiple bit digital signal includes a number of digital magnitudes representing a number of numeric values having a mean value associated therewith, and the sign signal indicates whether a corresponding one of such numeric values is positive or negative with respect to such mean value. The sampling circuits are coupled to the sampling controller and are configured to receive the sampling control signals and in accordance therewith sample a reference signal and in accordance therewith provide an analog signal which corresponds to the multiple bit digital signal and includes a number of analog magnitudes representing the numeric values. In accordance with the sampling control signals, each one of the sampling circuits is used to sample the reference signal: a first substantially equal number of times when, in accordance with the sign signal, each one of the numeric values represented by the multiple bit digital signal is positive with respect to the mean value; and a second substantially equal number of times when, in accordance with the sign signal, each one of the numeric values represented by the multiple bit digital signal is negative with respect to the mean value.

In accordance with another embodiment of the present invention, a bipolar, element averaging, digital to analog signal converter includes a sampling controller and a number of sampling circuits. The sampling controller is configured to receive a multiple bit digital signal and a sign signal and in accordance therewith provide a number of sampling control signals. The multiple bit digital signal includes a plurality of digital magnitudes representing a number of numeric values having a mean value associated therewith, and the sign signal indicates whether a corresponding one of such numeric values is positive or negative with respect to such mean value. The sampling circuits are coupled to the sampling controller and are configured to receive the sampling control signals and in accordance therewith sample a reference signal and in accordance therewith provide an analog signal which corresponds to the multiple bit digital signal and includes a number of analog magnitudes representing the numeric values. In accordance with the sampling control signals, each one of the sampling circuits is used to sample the reference signal: successively in a first rotating sequence when, in accordance with the sign signal, each one of the numeric values represented by the multiple bit digital signal is positive with respect to the mean value; and successively in a second rotating sequence when, in accordance with the sign signal, each one of the numeric values represented by the multiple bit digital signal is negative with respect to the mean value.

These and other features and advantages of the present invention will be understood upon consideration of the following detailed description of the invention and the accompanying drawings.

BRIEF DESCRIPTION OF THE DRAWINGS

FIG. 4 illustrates an example of the rotational sequential use of the capacitors in the circuits of FIGS. 2 and 3.

FIG. 7 identifies the clock signal phases used for controlling the switches for both positive and negative signals.

FIG. 8 illustrates the decoding and capacitor selection for the circuit of FIG. 2.

DETAILED DESCRIPTION OF THE INVENTION

Figure 1:
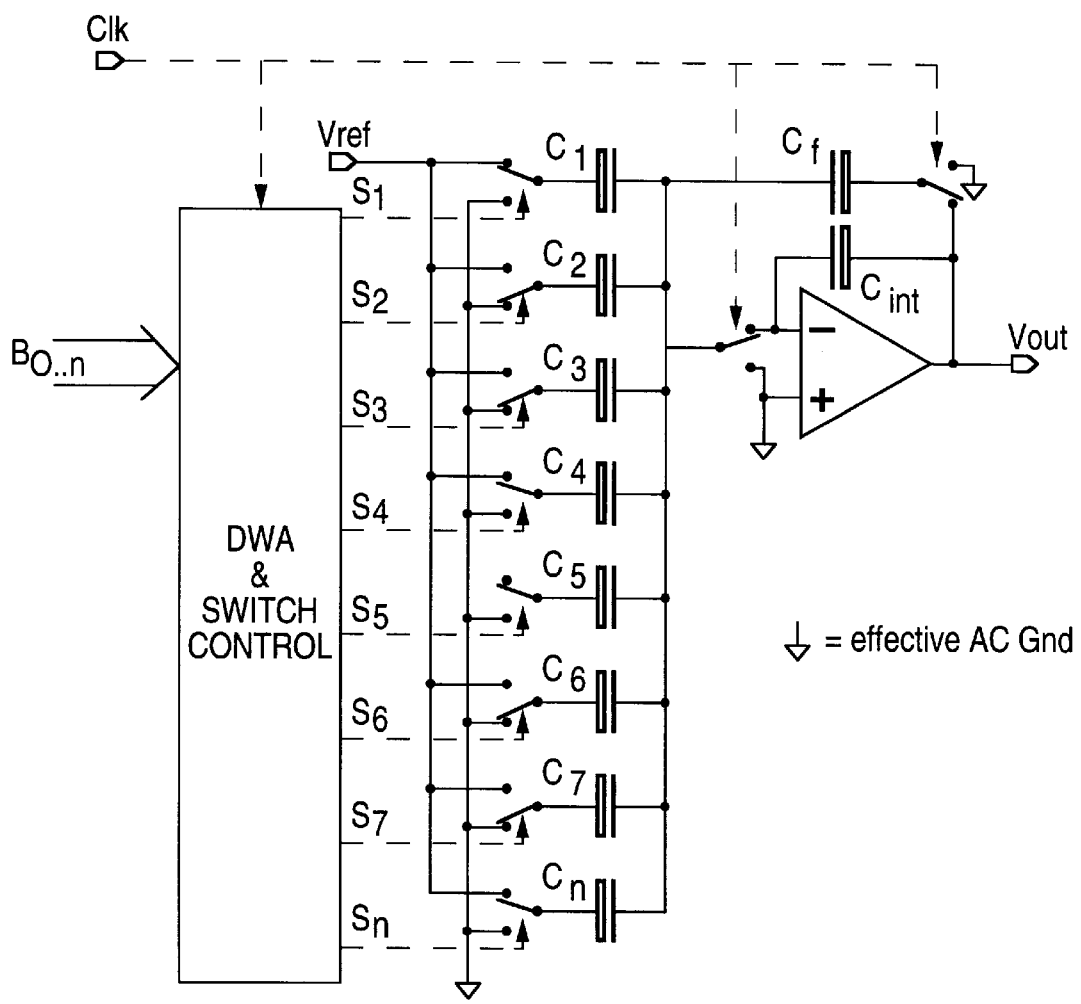
FIG. 1 is a schematic diagram of a conventional DWA DAC.
Figure 2:
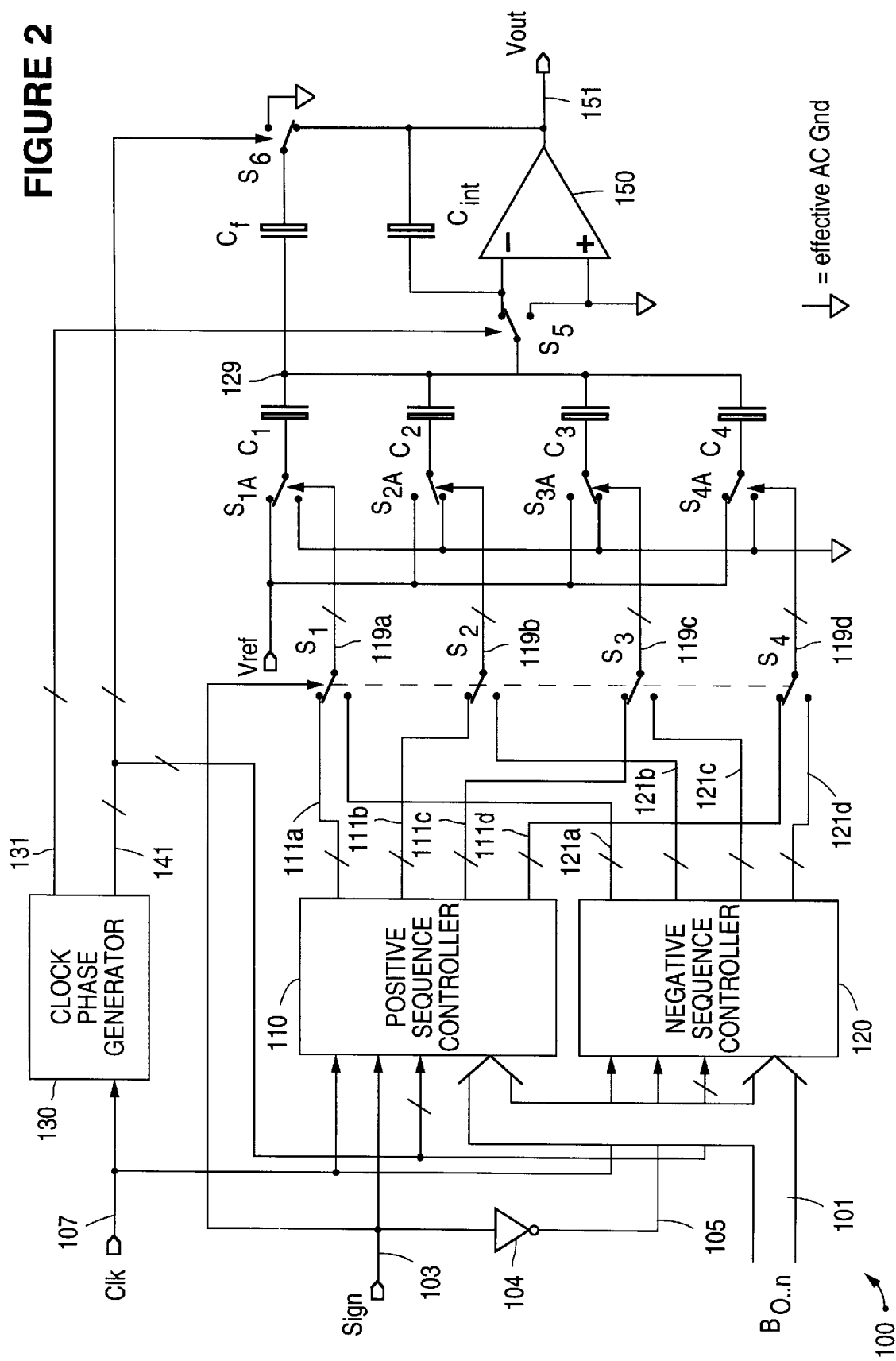
FIG. 2 is a schematic diagram of a bipolar, element averaging, digital-to-analog signal converter in accordance with one embodiment of the present invention.

Referring to FIG. 2, a bipolar, element averaging, digital-to-analog signal converter 100 in accordance with one embodiment of the present invention includes positive 110 and negative 120 sequence controllers, a clock phase generator 130, an inverter 104, a differential amplifier 150, control switches S1–S4, sampling capacitors C1–C4, integration and hold capacitors CINT, CF and sampling switches S1A–S4A, S5, S6, all interconnected substantially as shown. The sequence controllers 110, 120 receive the multiple bit input digital signal 101 plus a sign bit signal 103 and its inverse 105. The sign bit signal 103 indicates whether the input digital signal 101 has a numeric value which is positive or negative with respect to the mean value of the full range of values of the input digital signal 101. The sign bit signal 103 is also used to control the switching of the control switches S1–S4, such that when the sign bit indicates that the input digital signal 101 is "positive," i.e., with respect to the mean value, the sampling control signals 111a–111d from the positive sequence controller 110 are used to control the sampling switches S1A–S4A. Conversely, when the sign bit 103 indicates that the input digital signal 101 is "negative," the control signals 121a–121d from the negative sequence controller 120 are used to control the sampling switches S1A–S4A. These sampling switches S1A–S4A are controlled via the switched control signals 119a–119d from the control switches S1–S4.

The input clock signal 107 is used by the clock phase generator 130 to generate multiple phase clock signals 131, 141 for controlling the sampling switches S5 and S6, and for use by the sequence controllers 110, 120 (discussed in more detail below). The frequency of the clock signal 107 is equal to the oversampling frequency and generates a low pass filter pole with the feedback capacitor CF and integration capacitor CINT. The ratio of the feedback capacitance CF to the sum of the actively switched sampling capacitors C1–C4 determines the gain of the sample and hold amplifier formed by the differential amplifier 150 and capacitors C1–C4, CF, CINT.

Figure 3:
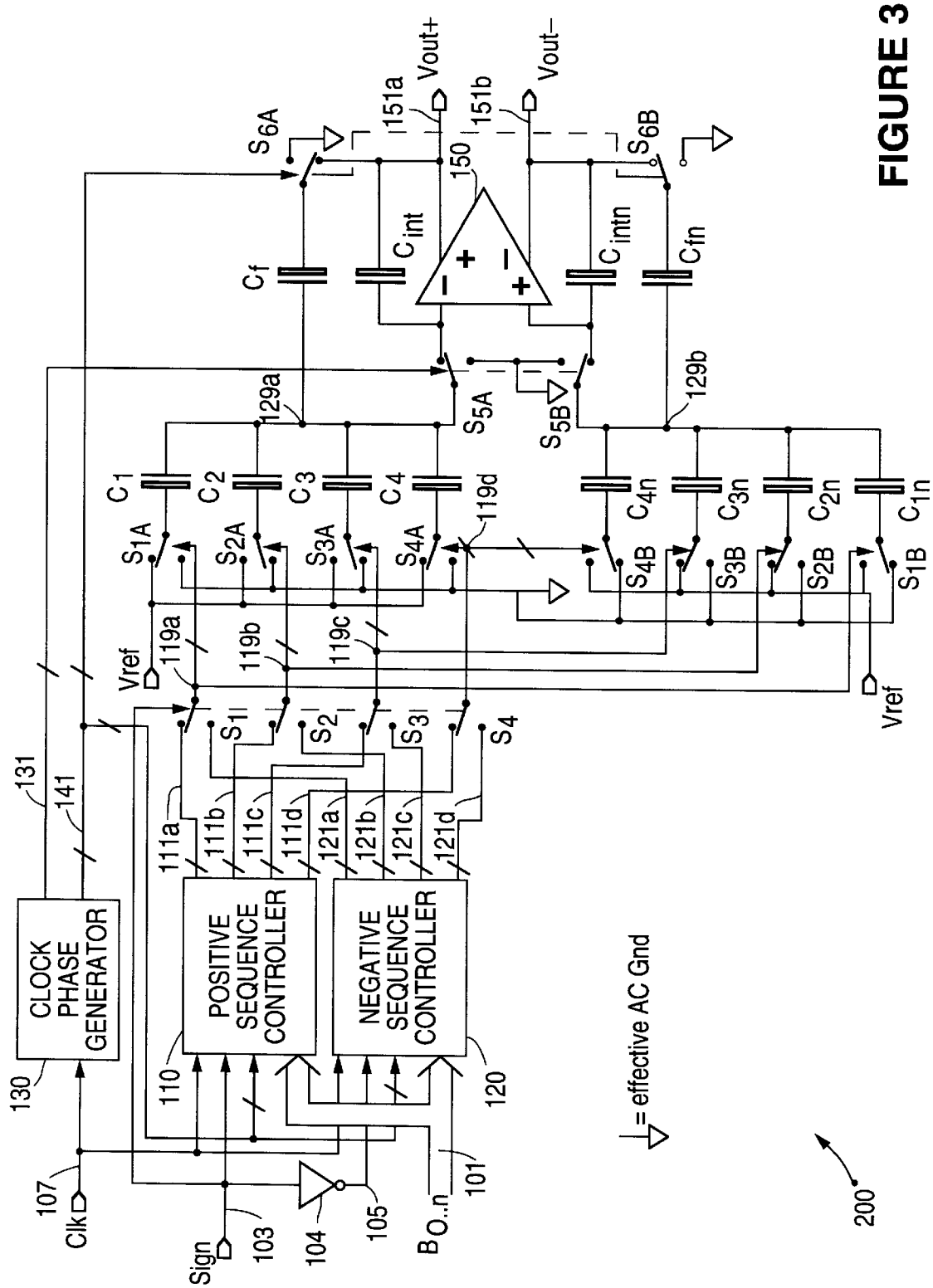
FIG. 3 is a schematic diagram of a bipolar, element averaging, digital-to-analog signal converter in accordance with another embodiment of the present invention.

Referring to FIG. 3, the principles of the circuit 100 of FIG. 2 can be extended for use in a differential bipolar, element averaging, digital-to-analog signal converter 200 in accordance with another embodiment of the present invention. (Circuit elements corresponding to those in the circuit 100 of FIG. 2 are identified with corresponding numeric designators.) In this circuit embodiment 200, the sampling control signals 111a–111d, 121a–121d from the sequence controllers 110, 120 are used for controlling the two sets of sampling switches S1A–S4A, S1B–S4B used for generating the positive 151a and negative 151b phases of the differential output signal. The positive 129a and negative 129b analog sample signals across the positive capacitor array C1–C4 and negative capacitor array C1N–C4N, respectively, are equal in amplitude and opposite in phase. Additionally, the polarity of the voltage reference VREF can be positive or negative, as desired.

Referring to FIG. 4, an example of the results of the sequence control provided by the sequence controllers 110, 120 for a series of input digital signal 101 values illustrates how the circuit elements (capacitors C1–C4/C1N–C4N) are cycled in a rotating sequence and thereby ensured to be used an equal number of times for both positive and negative input values. The column labeled "value" identifies the numeric value of the input digital signal 101. The column labeled "polarity" identifies the polarity of the input digital signal 101 as represented by the sign bit signal 103. The column labeled "none" indicates when none of the sampling capacitors C1–C4, C1N–C4N are used to sample the reference voltage VREF. The remaining columns identify which of the sampling capacitors C1–C4, C1N–C4N are used for sampling the reference voltage VREF. The alphanumeric designators in these columns identify the pointer, or index, used by the sequence controllers 110, 120 to keep track of which element was used last and which element is to be used next. The "P" and "N" designators identify the positive and negative indices, respectively, which are tracked independently, as discussed above. It can be seen that the sampling capacitors C1–C4, C1N–C4N are used in rotating sequences an equal number of times for positive input values and an equal number of times for negative input values. In those instances where the input value is zero, no incrementing, or cycling, is done.

Figure 5:
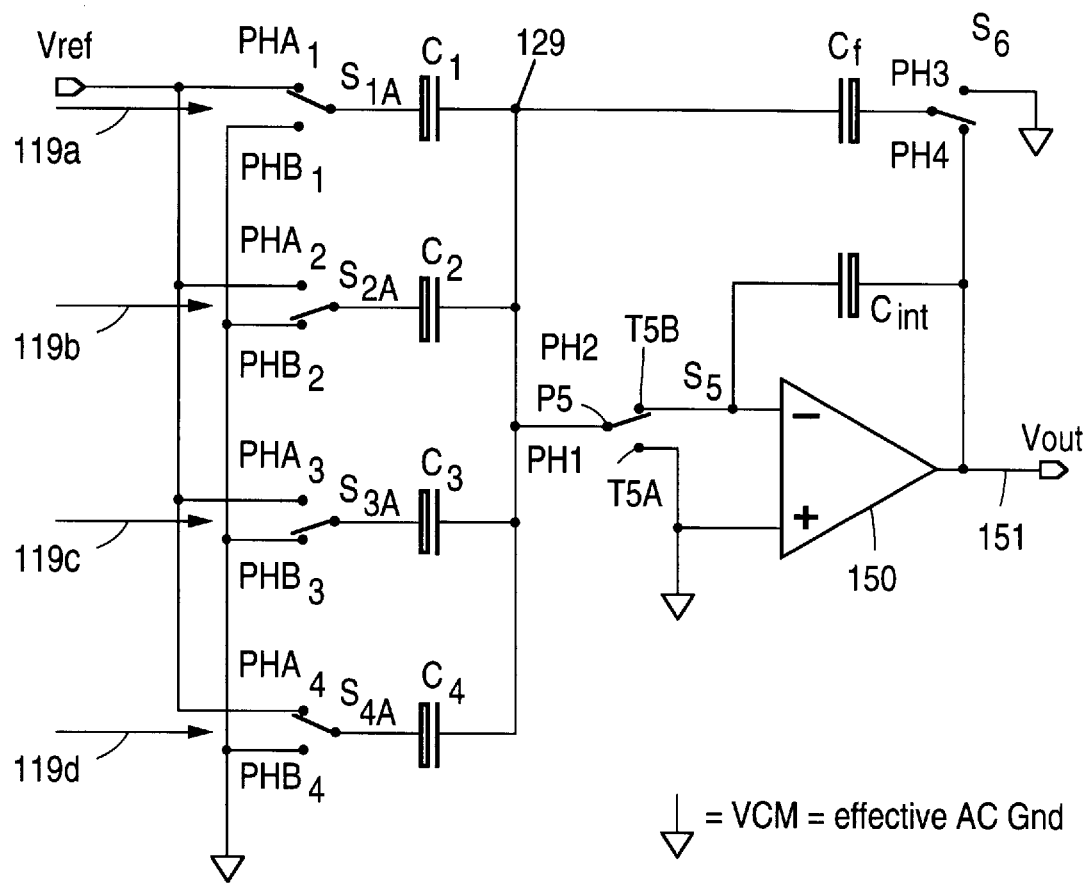
FIG. 5 is a more detailed schematic diagram of the sample and hold amplifier of the circuit of FIG. 2 identifying the phases of the clock signals used for controlling the switches.
Figure 6:
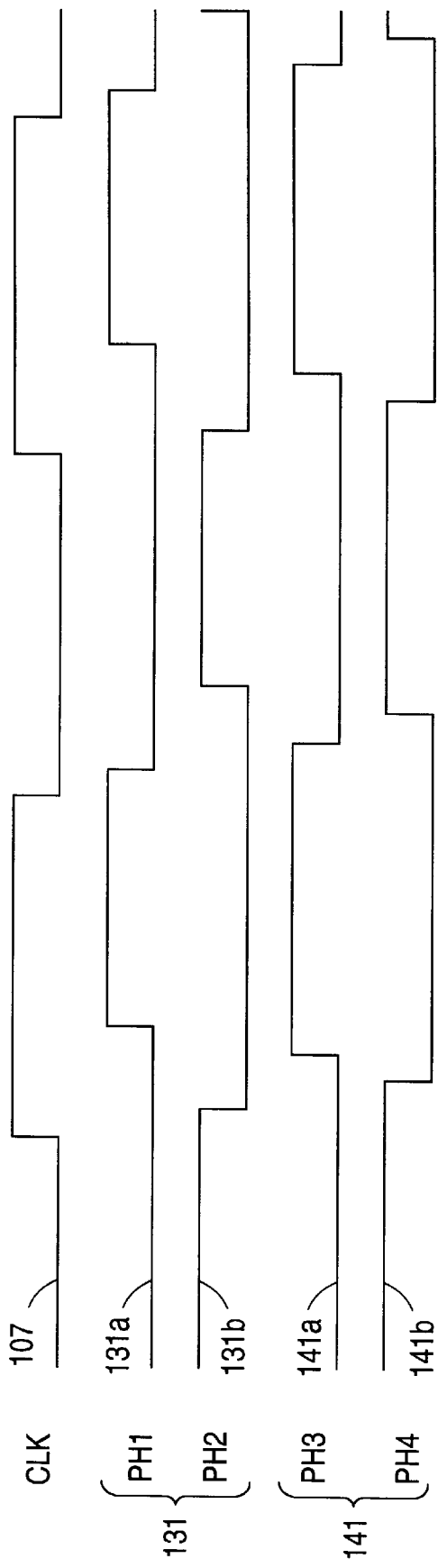
FIG. 6 is a signal timing diagram illustrating the clock phases used in the circuit of FIG. 5.

Referring to FIGS. 5 and 6 together, the above-discussed switching of the sampling capacitors C1–C4 can be explained as follows. (Although not shown, it should be understood that the following discussion also applies to sampling capacitors C1N–C4N for the differential circuit embodiment 200.) In this example, four sampling capacitors C1–C4 are used to generate a nine level DAC output: four positive values, four negative values and one zero value. A 4-phase non-overlapping clock is used to provide accurate charge transfer as well as minimize transient signals in the analog output signal 151 due to the switching of the circuit elements. Clock phases PH1 and PH2 which are generated by the clock phase generator 130 (FIGS. 2 and 3) based upon the input clock signal 107 are used to control switch S5 at the input of the differential amplifier 150. Clock phases PH3 and PH4 from the clock phase generator 130 are used to control switch S6 at the output of the differential amplifier 150. Clock phases PHA1–PHA4 and PHB1–PHB4 are gated versions of clock phases PH3 and PH4 and, by way of the positive 110 and negative 120 sequence controllers, control the input switches S1A–S4A to this sample and hold amplifier.

When each of these clock signal phases is in its logic high state, its respective controlled switch is in its on, i.e., connected, state, and, conversely, when each clock signal phase is in its logic low state, its respective controlled switch is in its off, i.e., disconnected, state. For example, referring to switch S5, when clock phase PH1 is in its logic high state (and phase PH2 is in its logic low state), the pole P5 of switch S5 is connected to throw T5A. When clock phase PH2 is in its logic high state (and phase PH1 is in its logic low state), the pole P5 is connected to throw T5B. When both phase PH1 and PH2 are in their logic low states, pole P5 is disconnected from both throws T5A, T5B. (It should be understood that, in accordance with well known integrated circuit techniques, these switches can be implemented using various forms of transistor circuits, such as pass gates or transmission gates.)

Referring to FIG. 7, the control of the switches S1A–S4A, S5, S6 for both positive and negative input signals can be represented as shown. Columns 1 and 2 indicate which of clock phases PH3 and PH4 is used for clock PHA1–PHA4 and PHB1–PHB4 for positive and negative input digital signal 101 values. (It should be noted that these phases are for the case where the reference voltage VREF is negative, i.e., lower in potential, with respect to the circuit signal ground. If the voltage VREF were positive, then the clock phases would be interchanged accordingly.) As indicated in the "zero" column, no change in the switch state occurs, i.e., the switch stays in its previous state, when the input digital signal 101 value is zero. (Alternatively, for a further reduction in signal noise, the "input plates" of capacitors C1–C4 can be connected to the system signal ground by asserting clock phases PHB1–PHB4, respectively, when the input digital signal 101 value is zero.) As indicated in the "comment" column, the identified clock phases are used by the respective switches (FIG. 5) only if such switches are selected for active control by a sequence controller 110, 120, otherwise no change in the switch state occurs (or the "input plates" of capacitors C1–C4 are connected to the system signal ground, as noted above), e.g., as in the situation where a zero input value is received.

Referring to FIG. 8, the above-discussed operation of a bipolar, element averaging, digital-to-analog signal converter in accordance with the present invention can be summarized as shown. The first and fourth columns identify the start and end values, respectively, of the indices used by the sequence controllers 110, 120 (FIGS. 2 and 3). The second column identifies the output value needed from the DAC. The third column identifies the selected capacitors based upon the aforementioned index values. The last (fifth) column indicates which of sampling capacitors C1–C4 is or is not selected in each case.

The final index value (column 4) is the sum of the initial index value (column 1) and the modulator output (column 2). For this example of four levels, each of the sequence controllers 110, 120 can be implemented as a 2-bit adder which overflows, or cycles, upon reaching its maximum count, plus some simple decoding logic so as to ensure selection of the correct sampling capacitors C1–C4 such that each capacitor is used an equal number of times in sequence. Each sequence controller 110, 120 implements the sequences shown in this table, with only one sequence controller 110, 120 being used at one time in accordance with the polarity of the input.

The above-discussed embodiments of the present invention use capacitors as the sampling elements. Capacitors are very effective in generating positive and negative signals around a "zero" point by simply changing the switch phasing on their bottom plates. This has an additional benefit of only requiring a single polarity voltage reference which, in turn, implies equal gains for both positive and negative signals, thereby resulting in lower second harmonic distortion as compared to dual voltage reference designs. However, it should be understood that other applications, such as switched currents, e.g., as opposed to the above-discussed sampled voltages, may be used to similar advantage with the "positive" and "negative" sequence controllers discussed above. Additionally, the above-discussed converter can be used in digital to analog converters as well as analog to digital converters which use delta-sigma signal conversion techniques.

Based upon the foregoing, a number of advantages of a bipolar, element averaging, digital-to-analog signal converter in accordance with the present invention should be recognized. For example, the analog output signal is centered about a DC zero, regardless of the matching of the sampling components. Further, fewer analog components, e.g., capacitors, are required, thereby simplifying the task of component matching. Further still, the ratio of digital circuit elements to analog circuit elements is higher, thereby producing a circuit which can be scaled more easily in accordance with conventional circuit integration techniques. Moreover, the cycle, or sequencing, rate for the sampling components is double that of the prior art. This pushes any noise produced up to higher frequencies where it is more easily filtered out.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a bipolar, element averaging, digital to analog signal converter, comprising:
   a sampling controller configured to receive a multiple bit digital signal and a sign signal and in accordance therewith provide a plurality of sampling control signals, wherein
   said multiple bit digital signal includes a plurality of digital magnitudes representing a plurality of numeric values having a mean value associated therewith,
   said sign signal indicates whether a corresponding one of said plurality of numeric values represented by said multiple bit digital signal is positive or negative with respect to said mean value; and
   a plurality of sampling circuits, coupled to said sampling controller, configured to receive said plurality of sampling control signals and in accordance therewith sample a reference signal and in accordance therewith provide an analog signal which corresponds to said multiple bit digital signal and includes a plurality of analog magnitudes representing said plurality of numeric values;
   wherein, in accordance with said plurality of sampling control signals, each one of said plurality of sampling circuits is used to sample said reference signal
   a first substantially equal number of times when, in accordance with said sign signal, each one of said plurality of numeric values represented by said multiple bit digital signal is positive with respect to said mean value, and a second substantially equal number of times when, in accordance with said sign signal, each one of said plurality of numeric values represented by said multiple bit digital signal is negative with respect to said mean value.

2. The apparatus of claim 1, wherein:

said plurality of sampling control signals represents a first rotating sequence when said sign signal indicates that a corresponding one of said plurality of numeric values represented by said multiple bit digital signal is positive with respect to said mean value; and said plurality of sampling control signals represents a second rotating sequence when said sign signal indicates that a corresponding one of said plurality of numeric values represented by said multiple bit digital signal is negative with respect to said mean value.

3. The apparatus of claim 1, wherein, in accordance with said plurality of sampling control signals, each one of said plurality of sampling circuits is used to sample said reference signal:

successively in a first rotating sequence when, in accordance with said sign signal, each one of said plurality of numeric values represented by said multiple bit digital signal is positive with respect to said mean value; and successively in a second rotating sequence when, in accordance with said sign signal, each one of said plurality of numeric values represented by said multiple bit digital signal is negative with respect to said mean value.

4. The apparatus of claim 1, wherein said sampling controller comprises:

a first sequence controller circuit configured to receive said multiple bit digital signal and said sign signal and in accordance therewith provide a first plurality of sampling sequence signals;

a second sequence controller circuit configured to receive said multiple bit digital signal and said sign signal and in accordance therewith provide a second plurality of sampling sequence signals; and a plurality of switch circuits, coupled to said first and second sequence controller circuits, configured to receive said sign signal and in accordance therewith receive and select between said first and second pluralities of sampling sequence signals and in accordance therewith provide said selected one of said first and second pluralities of sampling sequence signals as said plurality of sampling control signals.

5. The apparatus of claim 4, wherein:

said first plurality of sampling sequence signals represents a first rotating sequence when said sign signal indicates that a corresponding one of said plurality of numeric values represented by said multiple bit digital signal is positive with respect to said mean value; and said second plurality of sampling sequence signals represents a second rotating sequence when said sign signal indicates that a corresponding one of said plurality of numeric values represented by said multiple bit digital signal is negative with respect to said mean value.

6. The apparatus of claim 1, wherein said plurality of sampling circuits comprises:

a reference node configured to receive said reference signal;

a plurality of capacitive circuits; and a plurality of switch circuits, coupled between said reference node and said plurality of capacitive circuits, configured to receive said plurality of sampling control signals and in accordance therewith electrically couple and decouple portions of said plurality of capacitive circuits to and from said reference node, respectively;

wherein said electrically coupled and decoupled portions of said plurality of capacitive circuits together provide said analog signal.

7. The apparatus of claim 6, further comprising an integrator circuit, coupled to said plurality of capacitive circuits, configured to receive and integrate said analog signal.

8. The apparatus of claim 7, wherein said plurality of sampling circuits and said integrator circuit together comprise a sample and hold amplifier.

9. The apparatus of claim 6, further comprising a low pass filter circuit, coupled to said plurality of capacitive circuits, configured to receive and low pass filter said analog signal.

10. An apparatus including a bipolar, element averaging, digital to analog signal converter, comprising:

a sampling controller configured to receive a multiple bit digital signal and a sign signal and in accordance therewith provide a plurality of sampling control signals, wherein said multiple bit digital signal includes a plurality of digital magnitudes representing a plurality of numeric values having a mean value associated therewith, said sign signal indicates whether a corresponding one of said plurality of numeric values represented by said multiple bit digital signal is positive or negative with respect to said mean value; and a plurality of sampling circuits, coupled to said sampling controller, configured to receive said plurality of sampling control signals and in accordance therewith sample a reference signal and in accordance therewith provide an analog signal which corresponds to said multiple bit digital signal and includes a plurality of analog magnitudes representing said plurality of numeric values;

wherein, in accordance with said plurality of sampling control signals, each one of said plurality of sampling circuits is used to sample said reference signal successively in a first rotating sequence when, in accordance with said sign signal, each one of said plurality of numeric values represented by said multiple bit digital signal is positive with respect to said mean value, and successively in a second rotating sequence when, in accordance with said sign signal, each one of said plurality of numeric values represented by said multiple bit digital signal is negative with respect to said mean value.

11. The apparatus of claim 10, wherein:

said plurality of sampling control signals represents said first rotating sequence when said sign signal indicates that a corresponding one of said plurality of numeric values represented by said multiple bit digital signal is positive with respect to said mean value; and said plurality of sampling control signals represents said second rotating sequence when said sign signal indicates that a corresponding one of said plurality of numeric values represented by said multiple bit digital signal is negative with respect to said mean value.

12. The apparatus of claim 10, wherein said sampling controller comprises:

a first sequence controller circuit configured to receive said multiple bit digital signal and said sign signal and in accordance therewith provide a first plurality of sampling sequence signals;

a second sequence controller circuit configured to receive said multiple bit digital signal and said sign signal and in accordance therewith provide a second plurality of sampling sequence signals; and a plurality of switch circuits, coupled to said first and second sequence controller circuits, configured to receive said sign signal and in accordance therewith receive and select between said first and second pluralities of sampling sequence signals and in accordance therewith provide said selected one of said first and second pluralities of sampling sequence signals as said plurality of sampling control signals.

13. The apparatus of claim 12, wherein:

said first plurality of sampling sequence signals represents said first rotating sequence when said sign signal indicates that a corresponding one of said plurality of numeric values represented by said multiple bit digital signal is positive with respect to said mean value; and said second plurality of sampling sequence signals represents said second rotating sequence when said sign signal indicates that a corresponding one of said plurality of numeric values represented by said multiple bit digital signal is negative with respect to said mean value.

14. The apparatus of claim 10, wherein said plurality of sampling circuits comprises:

a reference node configured to receive said reference signal;

a plurality of capacitive circuits; and a plurality of switch circuits, coupled between said reference node and said plurality of capacitive circuits, configured to receive said plurality of sampling control signals and in accordance therewith electrically couple and decouple portions of said plurality of capacitive circuits to and from said reference node, respectively;

wherein said electrically coupled and decoupled portions of said plurality of capacitive circuits together provide said analog signal.

15. The apparatus of claim 14, further comprising an integrator circuit, coupled to said plurality of capacitive circuits, configured to receive and integrate said analog signal.

16. The apparatus of claim 15, wherein said plurality of sampling circuits and said integrator circuit together comprise a sample and hold amplifier.

17. The apparatus of claim 14, further comprising a low pass filter circuit, coupled to said plurality of capacitive circuits, configured to receive and low pass filter said analog signal.

18. A method of performing a bipolar, element averaging, digital to analog signal conversion, comprising the steps of:

receiving a multiple bit digital signal and a sign signal and in accordance therewith generating a plurality of sampling control signals, wherein said multiple bit digital signal includes a plurality of digital magnitudes representing a plurality of numeric values having a mean value associated therewith, said sign signal indicates whether a corresponding one of said plurality of numeric values represented by said multiple bit digital signal is positive or negative with respect to said mean value; and sampling a reference signal in accordance with said plurality of sampling control signals and in accordance therewith generating an analog signal which corresponds to said multiple bit digital signal and includes a plurality of analog magnitudes representing said plurality of numeric values;

wherein, in accordance with said plurality of sampling control signals, said reference signal is sampled a first substantially equal number of times when, in accordance with said sign signal, each one of said plurality of numeric values represented by said multiple bit digital signal is positive with respect to said mean value, and a second substantially equal number of times when, in accordance with said sign signal, each one of said plurality of numeric values represented by said multiple bit digital signal is negative with respect to said mean value.

19. The method of claim 18, wherein said step of sampling a reference signal in accordance with said plurality of sampling control signals and in accordance therewith generating an analog signal comprises sampling, in accordance with said plurality of sampling control signals, said reference signal:

successively in a first rotating sequence when, in accordance with said sign signal, each one of said plurality of numeric values represented by said multiple bit digital signal is positive with respect to said mean value; and successively in a second rotating sequence when, in accordance with said sign signal, each one of said plurality of numeric values represented by said multiple bit digital signal is negative with respect to said mean value.

20. The method of claim 18, wherein said step of receiving a multiple bit digital signal and a sign signal and in accordance therewith generating a plurality of sampling control signals comprises:

receiving said multiple bit digital signal and said sign signal and in accordance therewith generating first and second pluralities of sampling sequence signals; and receiving said sign signal and in accordance therewith receiving and selecting between said first and second pluralities of sampling sequence signals and in accordance therewith outputting said selected one of said first and second pluralities of sampling sequence signals as said plurality of sampling control signals.

21. The method of claim 18, wherein said step of sampling a reference signal in accordance with said plurality of sampling control signals and in accordance therewith generating an analog signal comprises receiving said plurality of sampling control signals and in accordance therewith electrically charging, with said reference signal, and discharging portions of a plurality of capacitive circuits to provide said analog signal.

22. The method of claim 21, further comprising the step of integrating said analog signal.

23. The method of claim 21, further comprising the step of low pass filtering said analog signal.

24. A method of performing a bipolar, element averaging, digital to analog signal conversion, comprising the steps of:

receiving a multiple bit digital signal and a sign signal and in accordance therewith generating a plurality of sampling control signals, wherein said multiple bit digital signal includes a plurality of digital magnitudes representing a plurality of numeric values having a mean value associated therewith, said sign signal indicates whether a corresponding one of said plurality of numeric values represented by said multiple bit digital signal is positive or negative with respect to said mean value; and sampling a reference signal in accordance with said plurality of sampling control signals and in accordance therewith generating an analog signal which corresponds to said multiple bit digital signal and includes a plurality of analog magnitudes representing said plurality of numeric values;

wherein, in accordance with said plurality of sampling control signals, said reference signal is sampled
successively in a first rotating sequence when, in accordance with said sign signal, each one of said plurality of numeric values represented by said multiple bit digital signal is positive with respect to said mean value, and
successively in a second rotating sequence when, in accordance with said sign signal, each one of said plurality of numeric values represented by said multiple bit digital signal is negative with respect to said mean value.

25. The method of claim 24, wherein said step of receiving a multiple bit digital signal and a sign signal and in accordance therewith generating a plurality of sampling control signals comprises:

receiving said multiple bit digital signal and said sign signal and in accordance therewith generating first and second pluralities of sampling sequence signals; and receiving said sign signal and in accordance therewith receiving and selecting between said first and second pluralities of sampling sequence signals and in accordance therewith outputting said selected one of said first and second pluralities of sampling sequence signals as said plurality of sampling control signals.

26. The method of claim 24, wherein said step of sampling a reference signal in accordance with said plurality of sampling control signals and in accordance therewith generating an analog signal comprises receiving said plurality of sampling control signals and in accordance therewith electrically charging, with said reference signal, and discharging portions of a plurality of capacitive circuits to provide said analog signal.

27. The method of claim 26, further comprising the step of integrating said analog signal.

28. The method of claim 26, further comprising the step of low pass filtering said analog signal.

* * * * *